US011114480B2

(12) United States Patent
Okhonin et al.

(10) Patent No.: US 11,114,480 B2
(45) Date of Patent: Sep. 7, 2021

(54) PHOTODETECTOR

(71) Applicant: Actlight SA, Lausanne (CH)

(72) Inventors: Serguei Okhonin, Lausanne (CH); Maxim Gureev, Lausanne (CH); Denis Sallin, Lausanne (CH)

(73) Assignee: ACTLIGHT SA, Lausanne (CH)

( * ) Notice: Subject to any disclaimer, the term of this patent is extended or adjusted under 35 U.S.C. 154(b) by 0 days.

(21) Appl. No.: 16/429,158

(22) Filed: Jun. 3, 2019

(65) Prior Publication Data

US 2020/0373338 A1 Nov. 26, 2020

Related U.S. Application Data

(63) Continuation-in-part of application No. 16/387,011, filed on Apr. 17, 2019, now Pat. No. 10,964,837, which is a continuation-in-part of application No. 15/461,645, filed on Mar. 17, 2017, now Pat. No. 10,269,855, which is a continuation-in-part of application No. 14/194,928, filed on Mar. 3, 2014, now Pat. No. 9,735,304.

(Continued)

(51) Int. Cl.
*H01L 31/0352* (2006.01)
*H01L 27/146* (2006.01)

(52) U.S. Cl.
CPC .... *H01L 27/14605* (2013.01); *H01L 27/1463* (2013.01); *H01L 27/14636* (2013.01); *H01L 27/14683* (2013.01)

(58) Field of Classification Search
CPC ......... H01L 27/14607; H01L 31/02005; H01L 31/02016; H01L 31/0352
See application file for complete search history.

(56) References Cited

U.S. PATENT DOCUMENTS

2006/0039666 A1* 2/2006 Knights .......... H01L 31/035281
385/129
2008/0277701 A1 11/2008 Lee et al.
(Continued)

FOREIGN PATENT DOCUMENTS

WO 2005/078801 A1 8/2005

OTHER PUBLICATIONS

Fossum, et al., "A Review of the Pinned Photodiode for CCD and CMOS Image Sensors," IEEE Journal of the Electron Devices Society, vol. 2, No. 3, pp. 33-43, May 2014.
(Continued)

*Primary Examiner* — Jae Lee
(74) *Attorney, Agent, or Firm* — Wilmer Cutler Pickering Hale and Dorr LLP

(57) ABSTRACT

A photodetector device comprising n-type and p-type light absorbing regions arranged to form a pn-junction and n+ and p+ contact regions connected to respective contacts. The light absorbing regions and the contact regions are arranged in a sequence n+ p n p+ so that, after a voltage applied between the n+ and p+ contacts is switched from a reverse bias to a forward bias, electrons and holes which are generated in the light absorbing regions in response to photon absorption drift towards the p+ and n+ contact regions respectively, which causes current to start to flow between the contacts after a time delay which is inversely proportional to the incident light intensity.

17 Claims, 19 Drawing Sheets

Related U.S. Application Data

(60) Provisional application No. 61/786,781, filed on Mar. 15, 2013.

(56) References Cited

U.S. PATENT DOCUMENTS

| | | |
|---|---|---|
| 2010/0230720 A1 | 9/2010 | Wicks |
| 2010/0271108 A1 | 10/2010 | Sanfilippo et al. |
| 2011/0272561 A1 | 11/2011 | Sanfilippo et al. |
| 2012/0056096 A1 | 3/2012 | Abeles et al. |
| 2012/0313155 A1 | 12/2012 | Okhonin |
| 2014/0159188 A1 | 6/2014 | Maimon |
| 2017/0365636 A1 | 12/2017 | Mazzillo et al. |
| 2018/0247968 A1 | 8/2018 | Na et al. |
| 2019/0013427 A1 | 1/2019 | Ting et al. |
| 2019/0067357 A1 | 2/2019 | Cheng et al. |
| 2020/0185560 A1 | 6/2020 | Giroud-Garampon et al. |

OTHER PUBLICATIONS

Takahashi, et al., "A 45 nm Stacked CMOS Image Sensor Process Technology for Submicron Pixel," Article, Sensors, MDPI, www.mdpi.com/journal/sensors, pp. 1-13, Basel, Switzerland, Dec. 5, 2017.

Cova, et al., "Avalanche photodiodes and quenching circuits for single-photon detection," Applied Optics, vol. 35, No. 12, pp. 1956-1976, Apr. 20, 1996.

\* cited by examiner

PHOTODETECTOR

FIELD OF THE INVENTION

The present disclosure relates to a photodetector.

BACKGROUND

A traditional pn or pin photodetector is operated by being held at a constant reverse bias voltage. Incident photons are absorbed in a light absorbing region to generate electron-hole pairs which are swept to the contacts, so that the magnitude of the photocurrent is proportional to the intensity of the light incident on the photodiode.

A non-traditional type of photodetector is disclosed in US 2012/313155 A1 which, operates using pulsed voltages that are switched from reverse bias to forward bias. Switching to forward bias induces a photocurrent to flow across the device structure. However, the onset of the flow of photocurrent is not instantaneous, but rather occurs after a time delay from the onset of the light incidence. This time delay is referred to as the triggering time. The triggering time is proportional to the inverse of the light intensity, so triggering time is used as the measure of the intensity of the incident light.

FIG. 1A and FIG. 1B are schematic representations in section and plan view respectively of a photodetector as disclosed in US 2012/313155 A1. The growth direction, i.e. orthogonal to the plane of the wafer, is marked as the z-direction. First and second gates, Gate 1 and Gate 2, extend in the y-direction, and the direction orthogonal to the gates, in which the electrons and holes are swept out, is the x-direction. The section AA of FIG. 1A is in the xz-plane as indicated in FIG. 1B. Gate 1 and Gate 2 are arranged either side of a light absorbing region which forms part of a body region. The body region may be an intrinsic or a doped semiconductor such as silicon or germanium suitable for absorbing incoming photons of the wavelength range to be detected. Highly doped n+ and p+ regions are arranged either side of the body region beyond the gates and serve as outputs for reading out the photocurrent. The layers of the photodetector are epitaxially fabricated on a semiconductor-on-insulator (SOI) substrate. The gates are made of a conductive material (metal or semiconductor). The gates are spaced from the body region via an insulator or dielectric material (silicon oxide or silicon nitride). The photodetector is operated with the following bias voltages. A negative voltage VG1 is applied to Gate 1 (for example, −2V), a negative or zero voltage V1 is applied to the n+ region, a positive voltage VG2 applied to Gate 2 (for example, 2V) and a positive voltage V2 (for example, 1V) is applied to the p+ region. The triggering time of the photodetector is a function of the electric field in the body region and his hence tunable by adjusting the gate voltages. Under these bias conditions, photons incident onto the light absorbing region between the gates, e.g. from a fiber optic device, are absorbed and thereby generate electron-hole pairs which is then swept out by the electric field induced by the bias voltages and so detected as current flowing between the n+ and p+ regions.

BRIEF SUMMARY OF THE INVENTION

According to one aspect of the disclosure, there is provided a photodetector device comprising: first and second light absorbing regions composed of semiconductor material and which are doped respectively n-type and p-type, the light absorbing regions being configured to generate pairs of electrons and holes in response to absorption of photons when light is incident on the device; first and second contact regions composed of semiconductor material and which are doped respectively p-type and n-type, wherein the contact regions have higher doping concentrations than the light absorbing regions, and are labelled as p+ and n+ respectively; and first and second contacts connected to the first and second contact regions respectively. The n-type and p-type light absorbing regions and the n+ and p+ contact regions are arranged in a sequence n+ p n p+ so that, after a voltage applied between the n+ and p+ contacts is switched from a reverse bias to a forward bias, electrons and holes which are generated in the light absorbing regions in response to photon absorption drift towards the p+ and n+ contact regions respectively, which causes current to start to flow between the contacts after a time delay which is inversely proportional to the incident light intensity.

In some embodiments, the first and second light absorbing regions are arranged side-by-side in relation to a substrate. The first and second contact regions may be arranged laterally spaced apart either side of the first and second light absorbing regions.

In some embodiments, the first and second light absorbing regions are formed as respective epitaxial layers arranged on top of one another in relation to a substrate. The device may further comprise insulating trenches extending vertically through the structure to define a photodetector array of pixels. The trenches extend through the light absorbing regions and at least one of the contact regions so as to subdivide the photodetector into an array of pixels that are independently contacted, and so can be individually read out by suitable electronics. The photodetector may further comprise a semiconductor circuit layer, for example in silicon CMOS technology, arranged on the epitaxial layer that forms one of the first and second contact regions, the circuit layer comprising an array of read out sensors for the photodetector's pixel array electrically connected to the pixels with vias. In a refinement of the photodetector array, the pixels are each subdivided into an array of sub-pixels by further insulating trenches. The further trenches for each pixel are disposed laterally inside the pixel-defining insulating trenches. The further trenches extend vertically through one of the contact regions and at least one of the light absorbing regions, but not as far as the other of the contact regions, so that the sub-pixels of any one pixel remain commonly contacted, so the sub-pixels of any one group are biased and read out as a single pixel unit.

In some embodiments, the first and second light absorbing regions are arranged such that one of the first and second light absorbing regions is formed as an epitaxial layer on a substrate, or integrally with the substrate, and the other of the first and second light absorbing regions is formed as an embedded region within the epitaxial layer.

In some embodiments, the first and second light absorbing regions are arranged such that one of the first and second light absorbing regions is formed in a first part as an epitaxial layer on a substrate, or integrally with the substrate, and in a second part as an embedded region within the epitaxial layer or the substrate, and wherein the other of the first and second light absorbing regions is formed as a further embedded region within the epitaxial layer. The embedded region and the further embedded region may be separated laterally by a portion of the epitaxial layer or the substrate. One of the first and second contact regions may be formed as a still further embedded region within the embedded region of the first or second light absorbing regions respectively. The first and second contact regions may be formed as respective still further embedded regions within the embedded regions of the first and second light absorbing regions respectively.

In some embodiments, one of the first and second contact regions is formed as an epitaxial layer on the substrate and at least one of the first and second light absorbing regions is formed at least in part as a further epitaxial layer on the epitaxial layer of said one of the first and second contact regions.

In some embodiments, at least one of the first and second contact regions is formed as an embedded region within an epitaxial layer which forms at least a part of the first and second light absorbing regions respectively.

In some embodiments, the first and second contact regions are formed as respective laterally spaced apart first and second embedded regions within an epitaxial layer which forms at least a part of the first and second light absorbing regions respectively.

In some embodiments, wherein one of the first and second contact regions is formed as laterally spaced apart first and second embedded regions formed within an epitaxial layer which forms at least a part of one of the first and second light absorbing regions respectively.

It will be understood that the semiconductor material from which the light absorbing regions are made is or are selected having regard to its or their band gaps in order that interband absorption of photons occurs over a desired energy range as required by the photodetector to fulfill a specification. The semiconductor material of the two light absorbing regions may be the same so that the pn-junction between the p-type and n-type regions is a homojunction, or two different semiconductor materials could be chosen so that the pn-junction is a heterojunction. In the case of a heterojunction the two different materials may be in the same materials' system and so be capable of forming alloys with each other, e.g. the SiGeC materials' system, or the GaAlInAsP materials' system.

According to another aspect of the disclosure, there is provided a method of manufacturing a photodetector device, the method comprising: fabricating first and second light absorbing regions composed of semiconductor material and which are doped respectively n-type and p-type, the light absorbing regions being configured to generate pairs of electrons and holes in response to absorption of photons when light is incident on the device; fabricating first and second contact regions composed of semiconductor material and which are doped respectively p-type and n-type, wherein the contact regions have higher doping concentrations than the light absorbing regions, and are labelled as p+ and n+ respectively; and providing first and second contacts connected to the first and second contact regions respectively. The n-type and p-type light absorbing regions and the n+ and p+ contact regions are arranged in a sequence n+ p n p+ so that, after a voltage applied between the n+ and p+ contacts is switched from a reverse bias to a forward bias, electrons and holes which are generated in the light absorbing regions in response to photon absorption drift towards the p+ and n+ contact regions respectively, which causes current to start to flow between the contacts after a time delay which is inversely proportional to the incident light intensity.

In the above method, the first and second light absorbing regions may be fabricated as respective epitaxial layers arranged on top of one another in relation to a substrate. Moreover, the method may further comprise fabricating insulating trenches extending vertically through the light absorbing regions and at least one of the contact regions so as to subdivide the photodetector into an array of pixels that are independently contacted. Further insulating trenches may be provided such that each pixel is subdivided into an array of sub-pixels by the further insulating trenches, which for each pixel are disposed laterally inside the pixel-defining insulating trenches and which extend vertically through one of the contact regions and at least one of the light absorbing regions, but not as far as the other of the contact regions, so that the sub-pixels of any one pixel remain commonly contacted.

According to a further aspect of the disclosure, there is provided a method of operating a photodetector device as specified above. The method comprises operating the photodetector device by repeatedly: applying a voltage to reverse bias the n+ and p+ contacts; switching the reverse bias voltage to a forward bias voltage so that after said switching electrons and holes which are generated in the light absorbing regions in response to photon absorption drift towards the p+ and n+ contact regions respectively; and sensing for onset of current flow between the first and second contacts. The time delay between said switching and said onset is measured, the time delay being inversely proportional to the incident light intensity. This reverse-to-forward biasing sequence is then repeated.

In summary, we propose a photodetector device and corresponding method of manufacture for a photodetector comprising n-type and p-type light absorbing regions arranged to form a pn-junction and n+ and p+ contact regions connected to respective contacts. The light absorbing regions and the contact regions are arranged in a sequence n+ p n p+ so that, after a voltage applied between the n+ and p+ contacts is switched from a reverse bias to a forward bias, electrons and holes which are generated in the light absorbing regions in response to photon absorption drift towards the p+ and n+ contact regions respectively, which causes current to start to flow between the contacts after a time delay which is inversely proportional to the incident light intensity.

BRIEF DESCRIPTION OF THE DRAWINGS

In the following, the present invention will further be described by way of example only with reference to exemplary embodiments illustrated in the figures.

DETAILED DESCRIPTION

In the following detailed description, for purposes of explanation and not limitation, specific details are set forth in order to provide a better understanding of the present disclosure. It will be apparent to one skilled in the art that the present disclosure may be practiced in other embodiments that depart from these specific details.

Figure 1A:
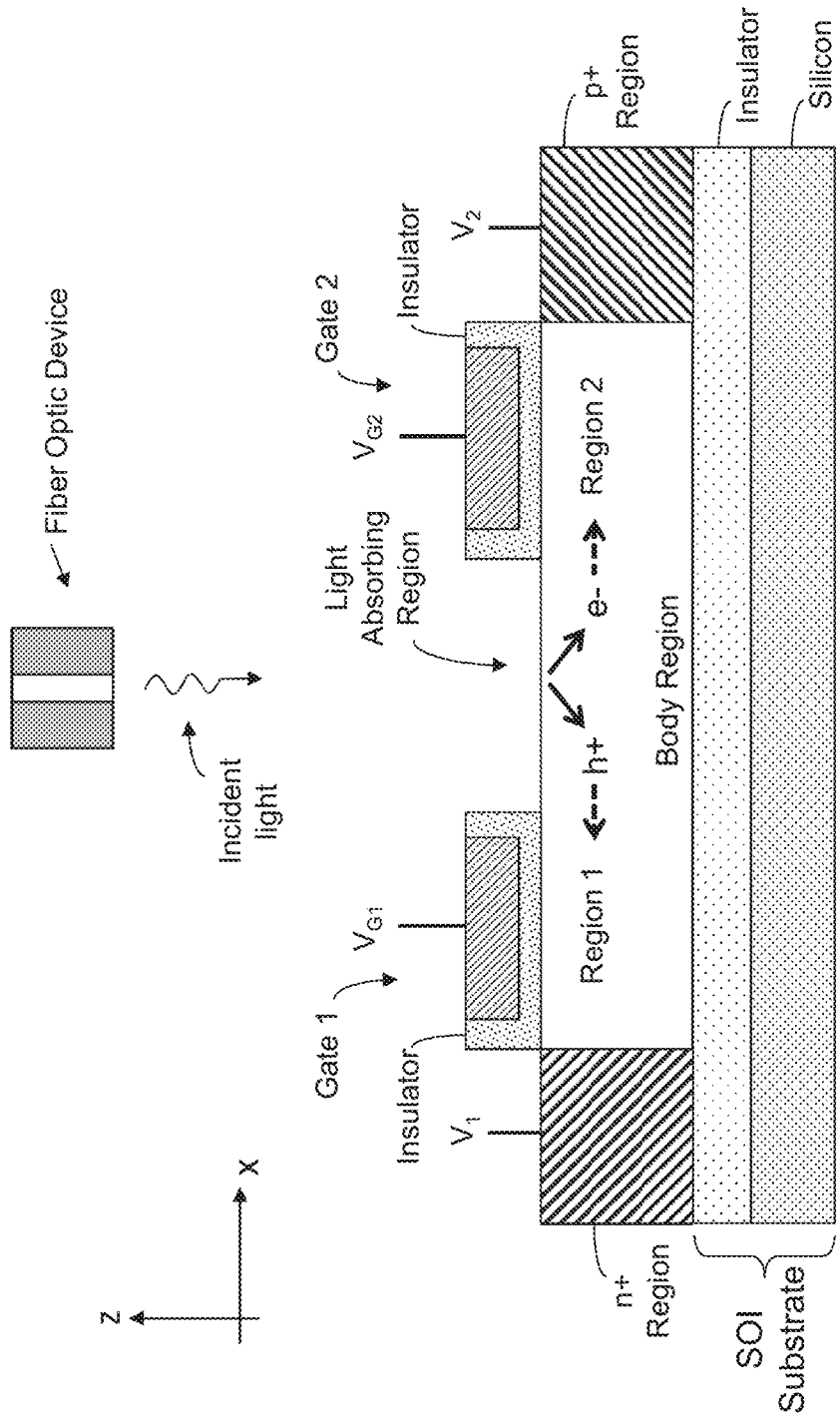
FIGS. 1A and 1B are schematic representations in section and plan view respectively of a prior art photodetector as disclosed in US 2012/313155 A1.
Figure 1B:
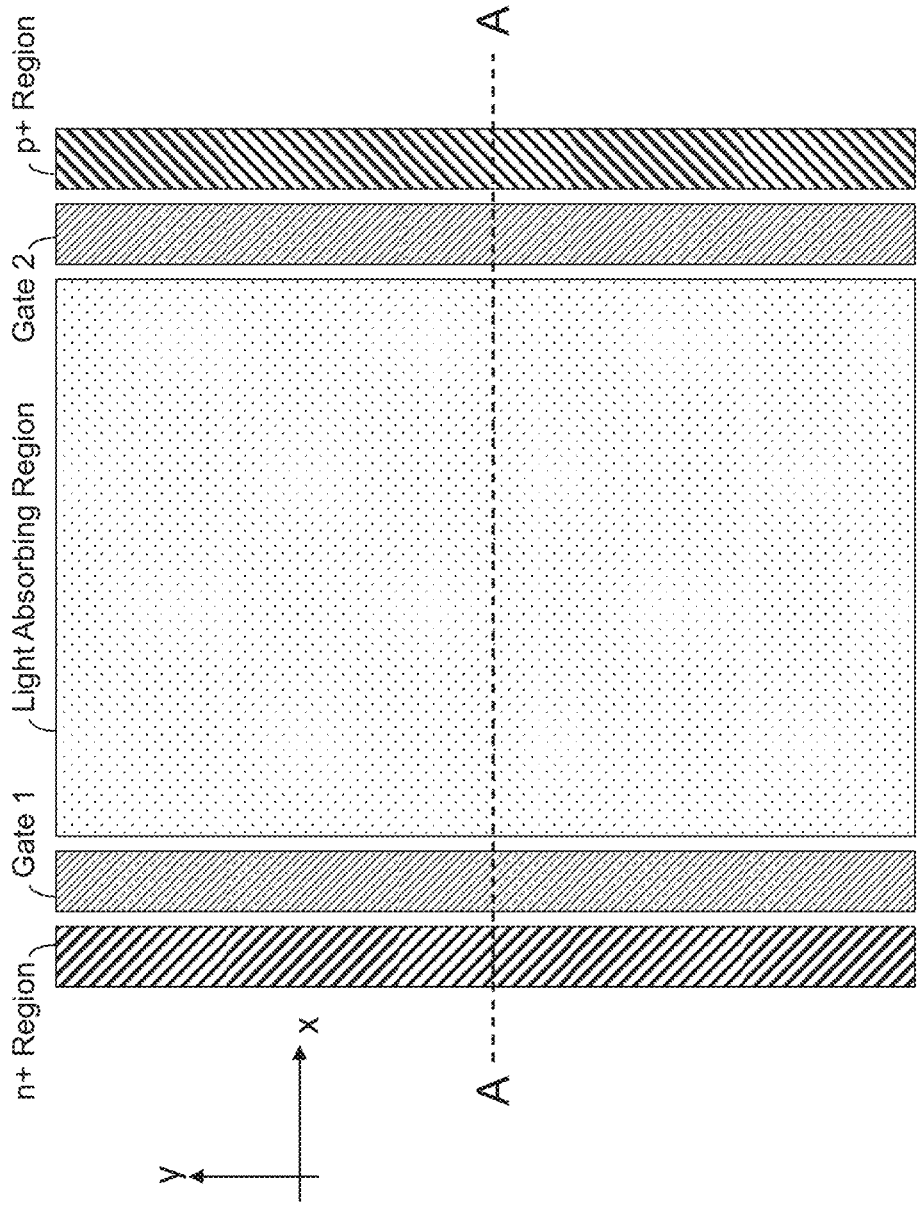
Figure 2A:
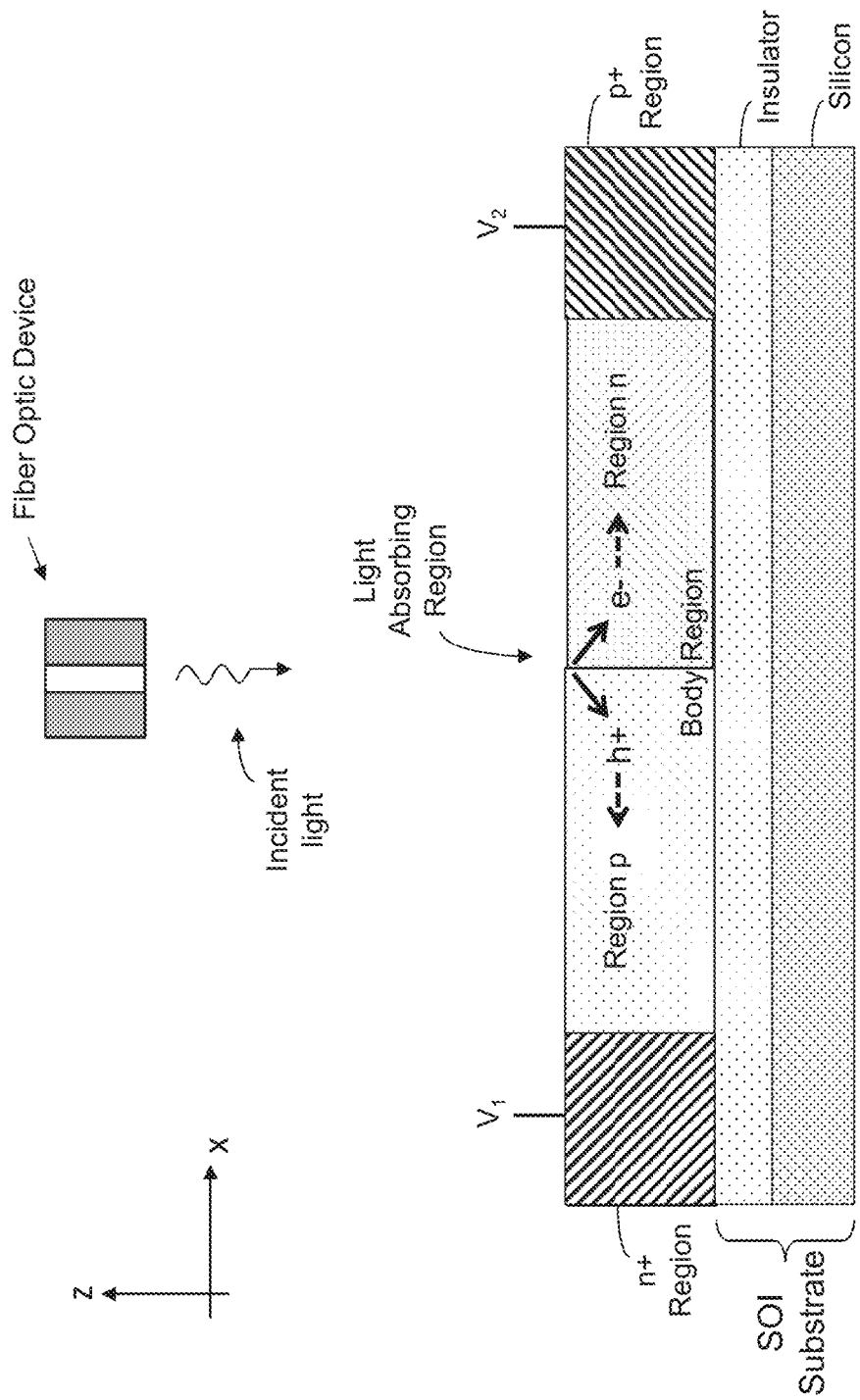
FIGS. 2A and 2B are schematic representations in section and plan view respectively of a photodetector according to a first embodiment of the invention.
Figure 2B:
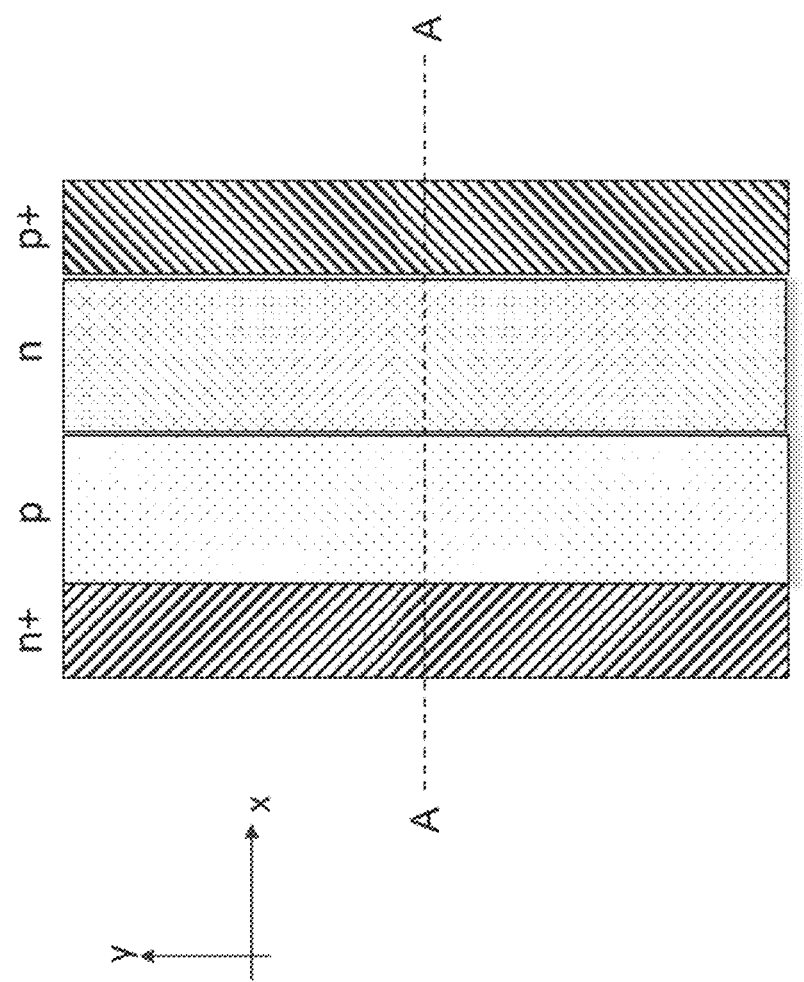

FIGS. 2A and 2B are schematic representations in section and plan view respectively of a photodetector according to a first embodiment of the invention.

The growth direction, i.e. orthogonal to the plane of the wafer, is marked as the z-direction. First and second contact regions, which are semiconductor regions doped n+ and p+ respectively, extend in the y-direction. The section AA of FIG. 2A is in the xz-plane as indicated in FIG. 2B. The contact regions are arranged either side of a body region which is formed in two parts, namely a p-doped semiconductor sub-region adjacent the n+ contact region, and an n-doped semiconductor region adjacent the p+ contact region, where the n-type and p-type subregions have a common interface where they meet. In the x-direction, the structure thus has the sequence in the x-direction of: n+-p-n-p+. The body sub-regions may be made of a suitable semiconductor material such as silicon or germanium or silicon carbide, or suitable alloy thereof, where the band gap is chosen to be suitable for absorbing incoming photons of the wavelength range to be detected. Highly doped n+ and p+ regions are arranged either side of the body region beyond the gates and serve as outputs for reading out the photocurrent. The layers of the photodetector are epitaxially fabricated on a semiconductor-on-insulator (SOI) substrate.

The photodetector can be operated with the following bias voltages. A negative or zero voltage V1 (for example, 0 or −1V) is applied to the n+ region and a positive voltage V2 (for example, +1V) is applied to the p+ region. The n- and p-type sub-regions of the body region are unbiased. The triggering time of the photodetector is a function of the electric field in the body region and his hence tunable by adjusting the bias voltages V1 and V2. Under these bias conditions, photons incident onto the light absorbing region, e.g. from a fiber optic device, are absorbed and thereby generate electron-hole pairs which is then swept out by the electric field induced by the bias voltages and so detected as current flowing between the n+ and p+ regions.

Figure 3A:
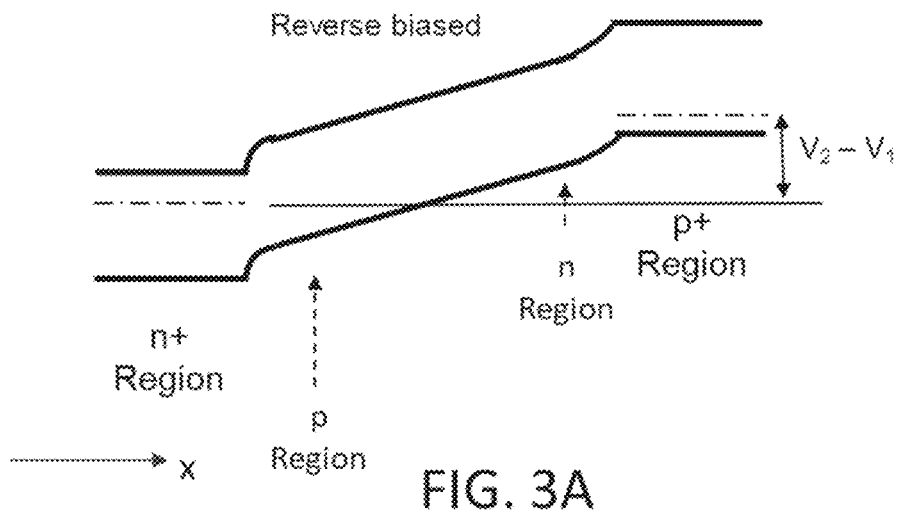
FIGS. 3A, 3B, and 3C are energy band diagrams showing a photodetector according to the first embodiment with the photodetector respectively in a reversed-biased state, in a forward-biased conducting state and a forward-biased non-conducting state.
Figure 3B:
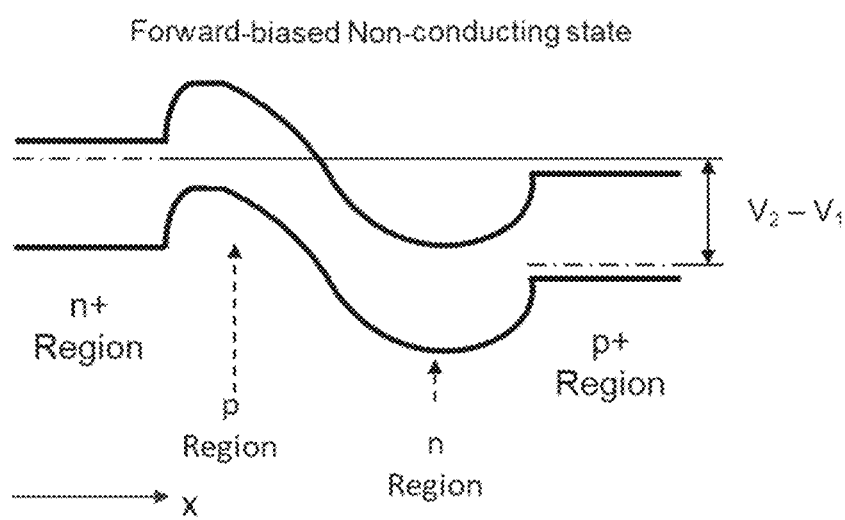
Figure 3C:
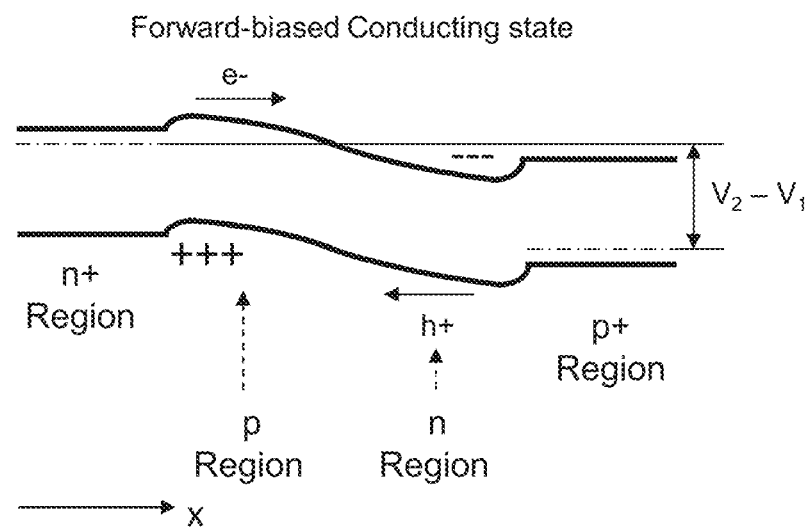

FIGS. 3A, 3B, and 3C are energy band diagrams along the x-direction. FIG. 3A shows the photodetector in reverse bias. FIGS. 3B and 3C both show the photodetector in forward bias with a bias voltage V2−V1. FIG. 3B shows a condition when no light is incident, resulting in the structure being in a non-conducting state, and FIG. 3C shows a condition when light is incident, resulting in the structure being in a conducting state. In forward bias, when the sensor does not detect any light, little to no current flows between the p+ and n+ regions due to the barrier provided or caused by the bias voltage V2−V1. However, when the sensor detects light, the incident photons are absorbed to generate electron-hole pairs and the sensor changes to a conducting state. Namely, under the electric field generated by the bias voltage, the holes move towards the n+ contact region, and the electrons move towards the p+ contact region. The migrated holes accumulate in the part of the p-region adjacent the n+ contact region and induce a lowering of the potential barrier to electron movement and electron current flow from the n+ region. Similarly, the migrated electrons accumulate in the part of the n-region adjacent the p+ contact region and induce a lowering of the hole barrier and hole current flowing from the p+ region. In its conductive state, the sensor provides a large internal current gain. In addition, a positive feedback mechanism accelerates accumulation of excess positive and negative carriers adjacent the respective n+ and p+ contact regions, which, in turn, reduce the potential barriers related corresponding to such regions and causes a current to flow between the p+ and n+ regions of the light sensor and an output current upon detecting or in response to the incident light.

Figure 4:
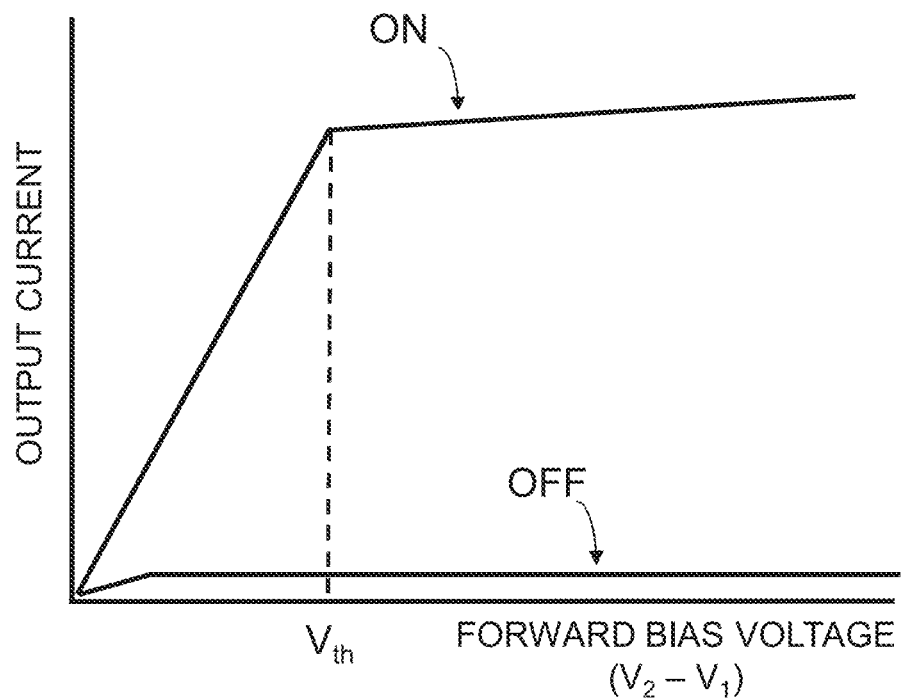
FIG. 4 is a graph of output current as a function of bias voltage for the photodetector according to the first embodiment of FIGS. 2A and 2B with ("ON") and without ("OFF") incident light, i.e. the forward-biased conducting and non-conducting states of FIGS. 3C and 3B respectively.

FIG. 4 is a schematic graph showing output current of the photodetector as a function of bias voltage V2−V1 between the n+ and p+ contact regions when incident light is detected ("ON"), and is not, detected ("OFF"), i.e. the conducting and non-conducting states of FIGS. 3C and 3B respectively. It is noted that above a threshold bias voltage Vth, the output current in the conducting state is more or less static with varying bias voltage, which is a preferred operating regime given that incident light intensity is measured by triggering time, not photocurrent magnitude.

Figure 5A:
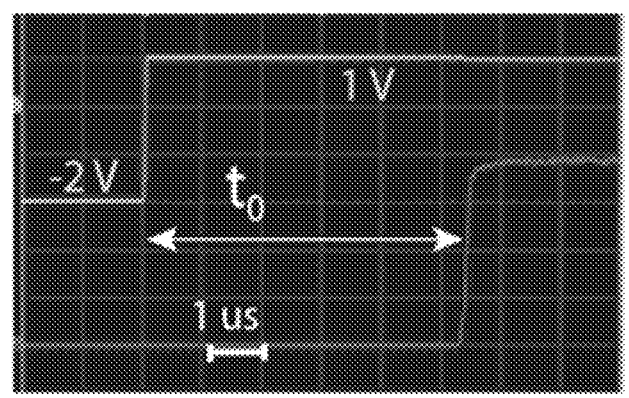
FIGS. 5A and 5B show oscilloscope scope screen shots of applied voltage $V_d$ and output current I without and with light, respectively.
Figure 5B:
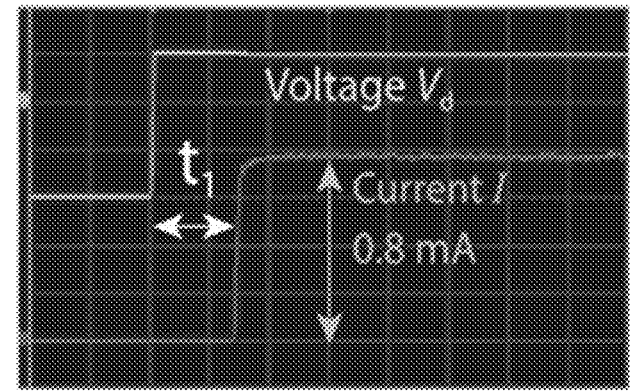

FIGS. 5A and 5B shows an oscilloscope screen shot of applied voltage Vd=V2−V1 and output current I without and with light, respectively. Triggering time t decreases with increase in light intensity. FIG. 5A shows a triggering time of t0=5.5 µs with no light. FIG. 5B shows a triggering time of t1=1.5 µs with light at an absorbed power of 35 nW. Switching from a low current state to a high current state occurs very abruptly, which is favorable for precise measurements of delay time. The output current of 0.8 mA is more than four orders higher than an output current that could be achieved with a conventional photodiode at an absorbed power of 35 nW.

Figure 6:
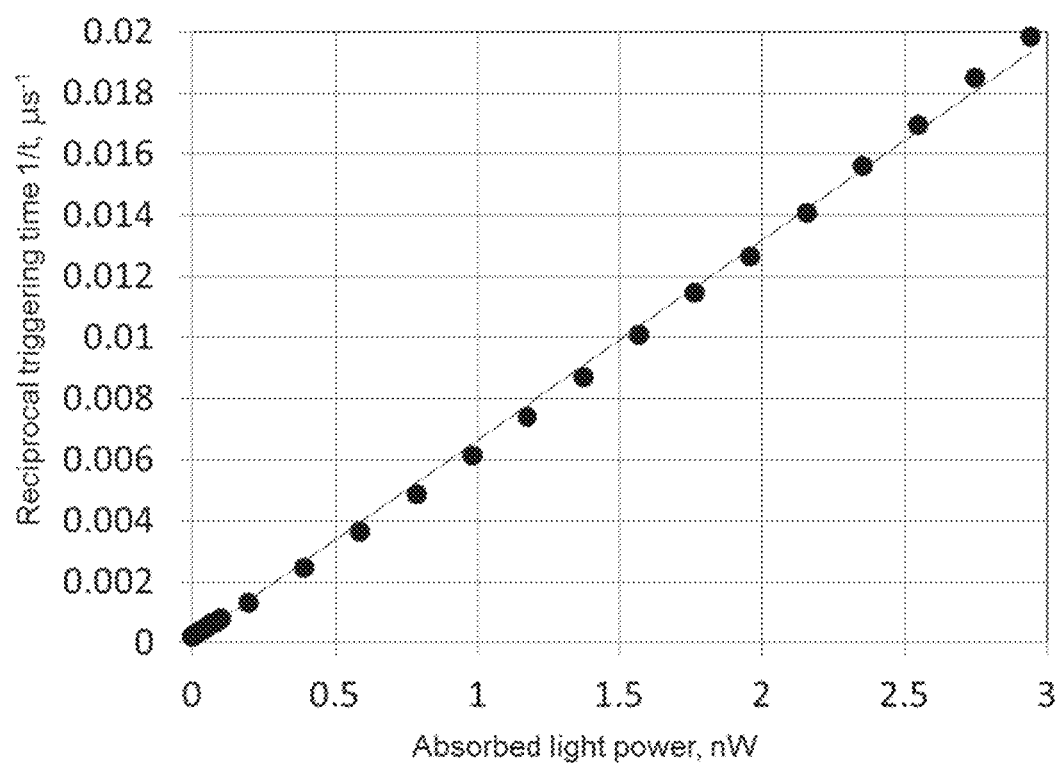
FIG. 6 is a graph plotting reciprocal triggering time as a function of absorbed light power.

FIG. 6 is a graph plotting reciprocal triggering time as a function of absorbed light power. As can be seen there is a linear relationship between the inverse of triggering time and absorbed light power.

Figure 7:
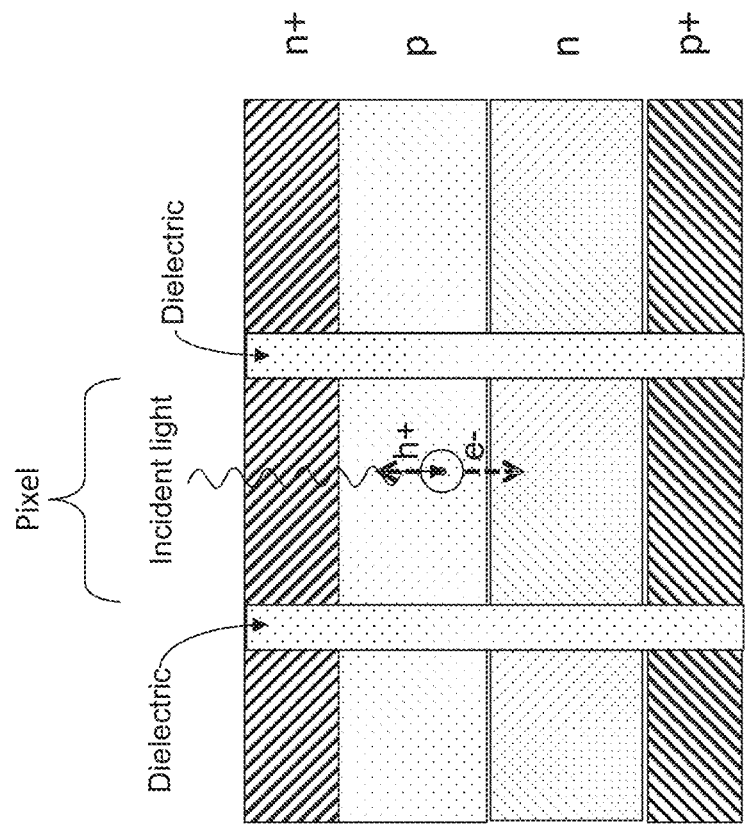
FIG. 7 is a schematic section of a photodetector according to a second embodiment of the invention.

FIG. 7 is a schematic section of a vertical photodetector according to a second embodiment of the invention. By vertical, we mean that the layers are epitaxially formed in the xy-plane, which is the plane of the substrate, so the layer sequence is in the z-direction. The structure is subdivided into individual pixels, in a one-dimensional array of rows, or a two-dimensional array of rows and columns by insulating trenches filled with dielectric material that electrically isolate adjacent pixels from each other. The dielectric material may be material that is deposited after etching, or material that is generated by an oxidization process after etching, for example. Instead of filling the trenches with dielectric material, they could be left unfilled or only be partly filled by a thin layer of oxide or other insulating material coating the sides of the trenches. The insulating trenches thus extend vertically through the light absorbing regions and at least one of the contact regions so as to subdivide the photodetector into an array of pixels that are independently contacted.

Semiconductor layers are deposited on a suitable substrate in the sequence p+ n p n+ as illustrated, or in the reverse sequence. The doping of each layer may be achieved at the time of deposition, or through post-deposition processes, such as ion implantation, or a combination of both, as desired. The n-type and p-type layers form the detector's light absorbing regions and the n+ and p+ layers its contact regions. The n-type and p-type layers have an interface which forms a pn-junction. The n-type and p-type layers have band gaps suitable for absorbing photons of a specified wavelength (energy) range and generate pairs of electrons and holes that drift towards the p+ and n+ layers respectively when the pn-junction is under a forward bias. An electron-hole pair generated by absorption of a photon in the p-layer (as schematically illustrated) or in the n-layer while the device is under forward bias are separated by the forward-bias induced applied electric field with holes drifting towards the n+ layer and electrons towards the p+ layer. The substrate is not shown, but a suitable substrate, such as a p+ substrate for ohmically contacting the pixels of the p+ layer, may be provided. When the structure is switched from a reverse bias to a forward bias in respect of the pn-junction, electron-hole pairs generated by photon absorption initiate a current flow between the contacts once a sufficient number of electrons and holes have drifted to cause the barrier to be decreased sufficiently. There is thus a time delay from the reverse-to-forward bias switching event to the onset of current flow which is inversely proportional to the incident light intensity.

The photodetector is operated by repeated cycles of switching from reverse to forward bias. Namely, operation proceeds by applying a voltage to reverse bias the n+ and p+ contacts; switching the reverse bias voltage to a forward bias voltage. After the switching, electrons and holes which are generated in the light absorbing regions in response to photon absorption drift towards the p+ and n+ contact regions respectively. The device then senses for onset of current flow between the first and second contacts. The time delay between said switching and said onset is measured, the time delay being inversely proportional to the incident light intensity. This reverse-to-forward biasing sequence is then repeated. The repeat cycling of the drive and read out may be periodic or aperiodic. In the periodic case, the duration of the forward bias and reverse bias segments are fixed. In the aperiodic case, the reverse bias segment is of fixed duration, but the forward bias duration is varied responsive to the incident light intensity within a time window set between a minimum value and a maximum value. After onset of current has occurred, and the time delay has been measured, the forward bias segment of the cycle can be terminated. The forward bias duration will then have the maximum value when there is no incident light, since there will be no onset of current, and have the minimum value when the incident light intensity is high, since the time delay will be shorter than the minimum value, but have an intermediate value when the incident light intensity is such that the time delay for the onset of current is within the window.

Figure 8:
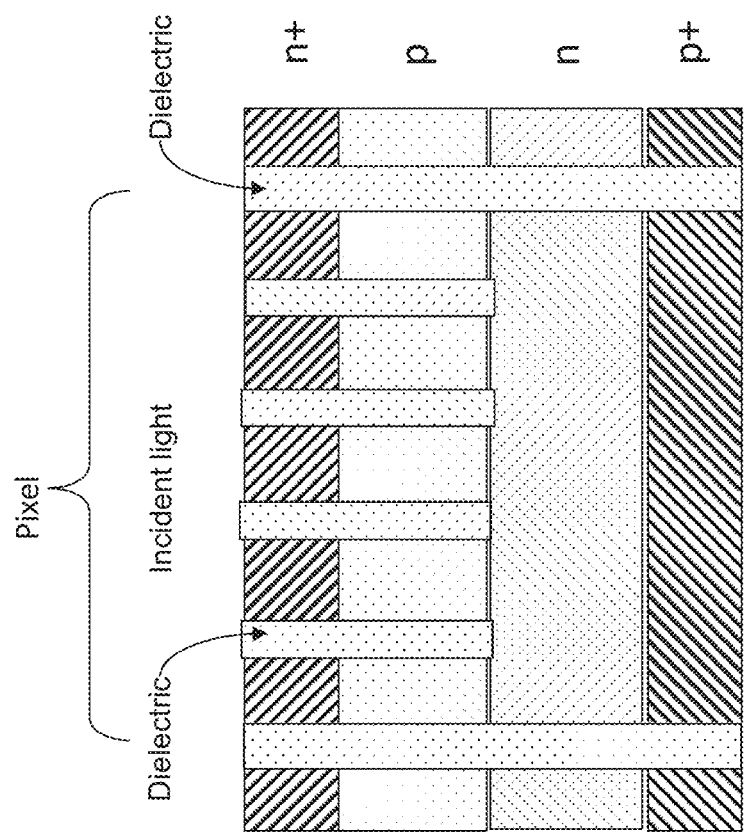
FIG. 8 is a schematic section of a photodetector according to a third embodiment of the invention.

FIG. 8 is a schematic section of a vertical photodetector according to a third embodiment of the invention, which will be largely understood from the previous discussion of FIG. 7. In the third embodiment, each pixel consists of a group of subpixels. As in the second embodiment, each pixel is defined by a dielectric material trench extending through the whole structure, i.e. through the n+ p n p+ layers. The subpixels of a given pixel are divided from each other by dielectric material trenches, but ones which extend partly, but not wholly, through the structure, namely at least through the top contact layer (here n+) and at least partway through the upper one of the light absorbing layers (here p) and possibly also partway through the lower one of the light absorbing layers (here n). Each pixel is thus subdivided into a one- or two-dimensional array of sub-pixels by further insulating trenches which for each pixel are laterally inside the pixel-defining insulating trenches and which extend vertically through one of the contact regions and at least one of the light absorbing regions, but not as far as the other of the contact regions, so that the sub-pixels of any one pixel remain commonly contacted. The subpixel structure may serve to reduce internal capacitance and thereby provide better sensitivity.

Figure 9:
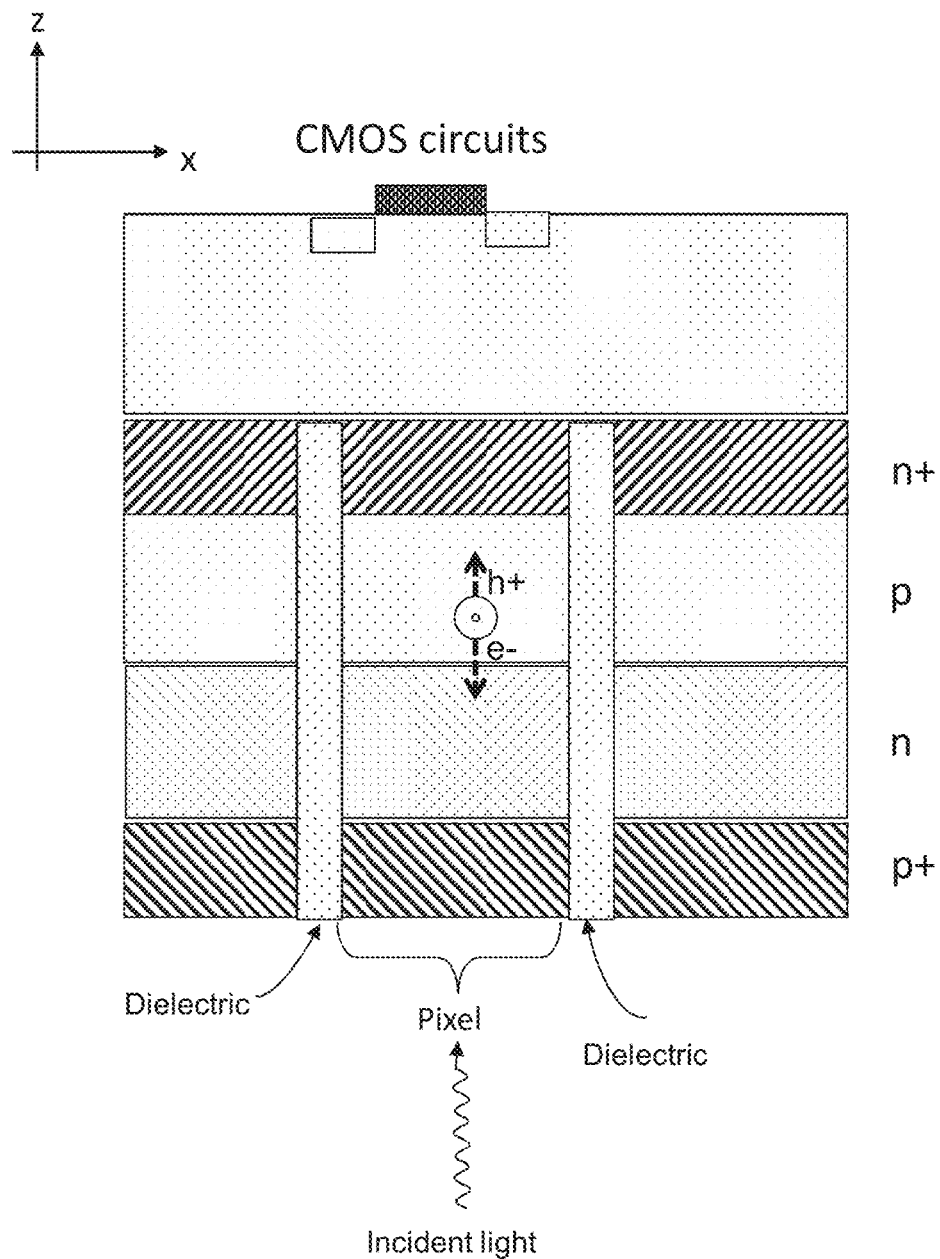
FIG. 9 is a schematic section of a photodetector according to a fourth embodiment of the invention.

FIG. 9 is a schematic section of a vertical photodetector according to a fourth embodiment of the invention. The photodetector structure shown in FIG. 7 is combined with a semiconductor circuit layer arranged on the upper contact region. The circuit layer comprises an array of read out sensors for the photodetector's pixel array with the sensor-to-pixel connections being implemented with vias. In particular, the circuit layer may be CMOS circuit layer which makes it electrical connections to the pixels with through-silicon vias (TSVs). Bias voltages can then be applied to the n+ and p+ contact regions through the TSVs. Moreover, signal current induced by incident light can be detected on a per pixel basis through the TSV connections. The CMOS circuit layer is shown arranged on the n+ contact layer, but alternatively it could be arranged on the p+ contact layer. The structure of FIG. 7 may also be combined with a CMOS circuit layer in similar fashion.

Figure 10:
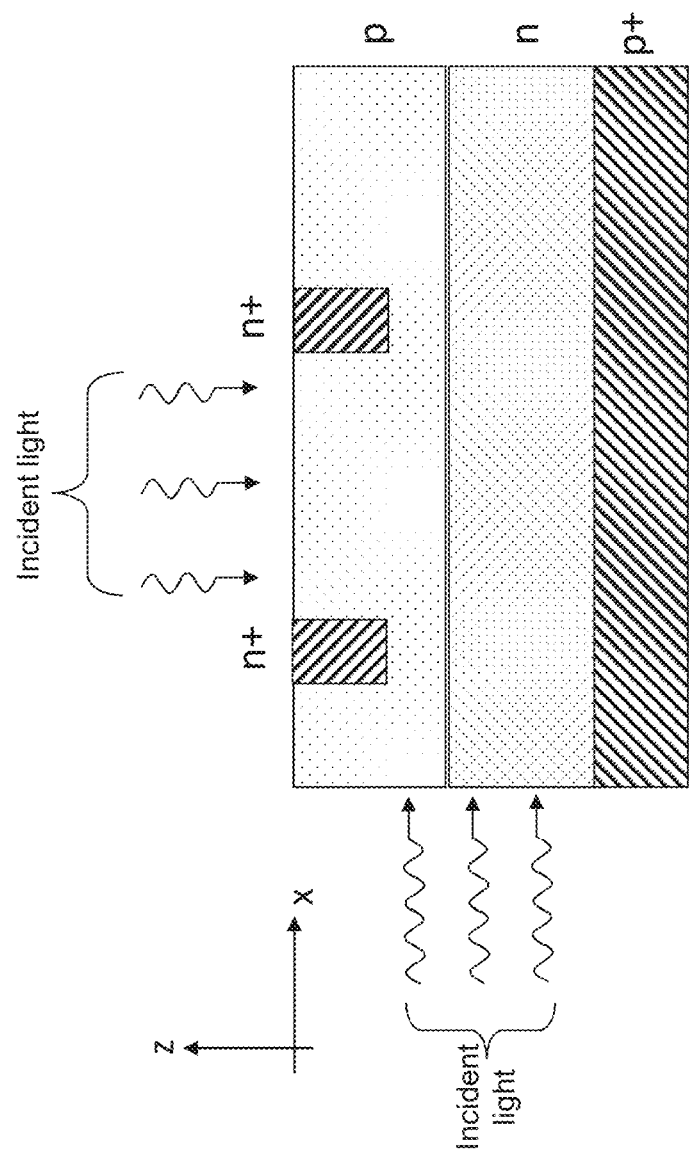
FIG. 10 is a schematic section of a photodetector according to a fifth embodiment of the invention.

FIG. 10 is a schematic section of a photodetector according to a fifth embodiment of the invention. This embodiment may be understood as a variant of the FIG. 7 embodiment in that the epitaxial layer structure from bottom to top comprises a p+ contact layer, an n-type layer and a p-type layer, where the n- and p-type layers form the light absorbing regions. However, instead of forming the top contact as an epitaxial layer, the top contact is formed with one or more embedded regions within the p-type epitaxial layer. Two adjacent embedded regions are shown, wherein an arrangement of adjacent embedded regions may serve to define a pixel. Alternatively, dielectric material trenches may be used as described in other embodiments. It is also noted that light may be incident from the cleaved side surface in some embodiments as schematically illustrated. The substrate is not shown, but a suitable substrate, such as a p+ substrate for ohmically contacting the p+ layer, may be provided. It will also be understood that the reverse structure could be implemented, i.e. as illustrated but with n+→p+, p→n, n→p, and p+→n+.

Figure 11:
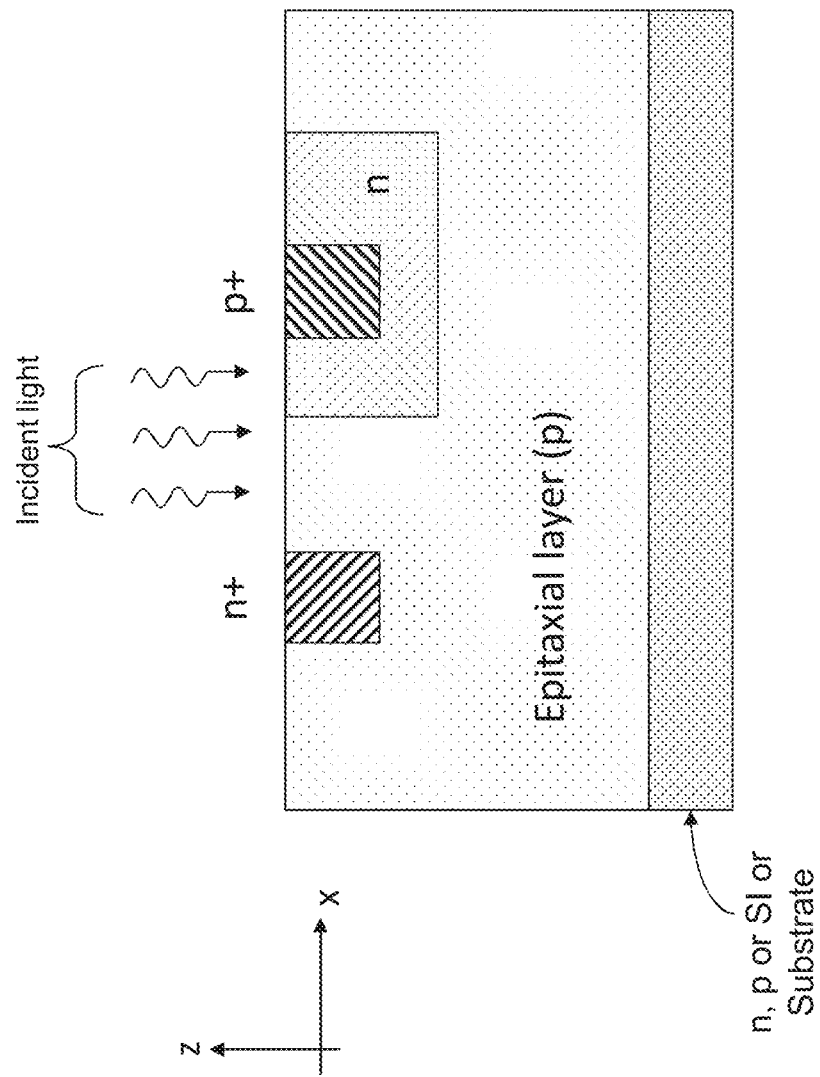
FIG. 11 is a schematic section of a photodetector according to a sixth embodiment of the invention.

FIG. 11 is a schematic section of a photodetector according to a sixth embodiment of the invention. A horizontal n+p n p+ structure is used which is somewhat similar conceptually to that of FIGS. 2A/2B. A p-type layer is deposited on a substrate. In the p-type layer, an embedded n-type region is formed, and within the n-type region a p+ contact region is formed. Laterally offset from the n-type region, an n+ contact region is formed in the p-type layer. It will also be understood that the reverse structure could be implemented. Moreover, the substrate is not an electrically active part of the device, so may be for example n-type, p-type, semi-insulating semiconductor, sapphire or an insulator, as desired.

Figure 12:
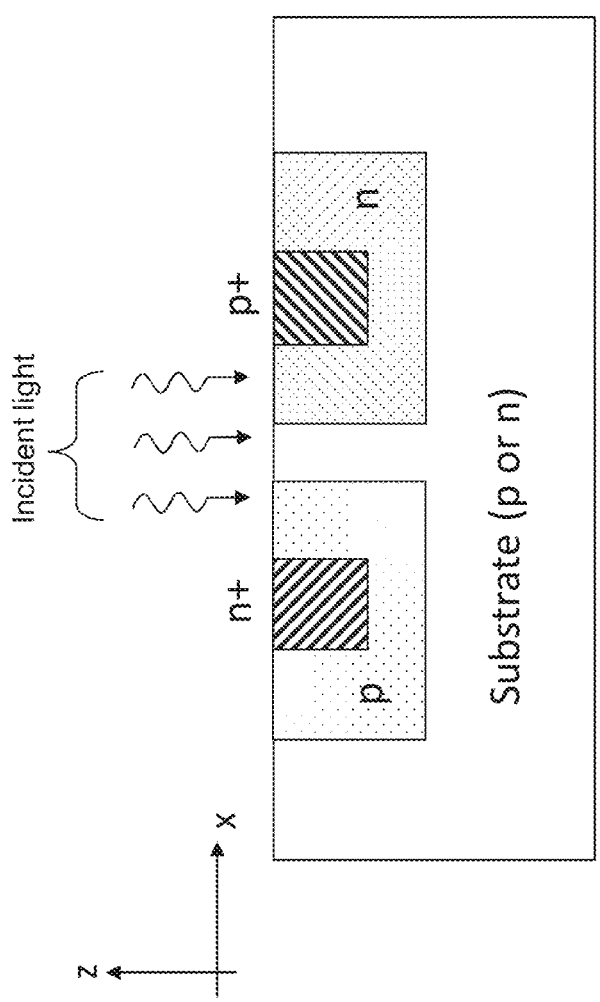
FIG. 12 is a schematic section of a photodetector according to a seventh embodiment of the invention.

FIG. 12 is a schematic section of a photodetector according to a seventh embodiment of the invention. A p-type or n-type substrate is provided. In a surface of the substrate, an embedded n-type region is formed, and within the n-type region a p+ contact region is formed. Laterally offset from the n-type region, a p-type embedded region is formed and within that an n+ contact region.

Figure 13:
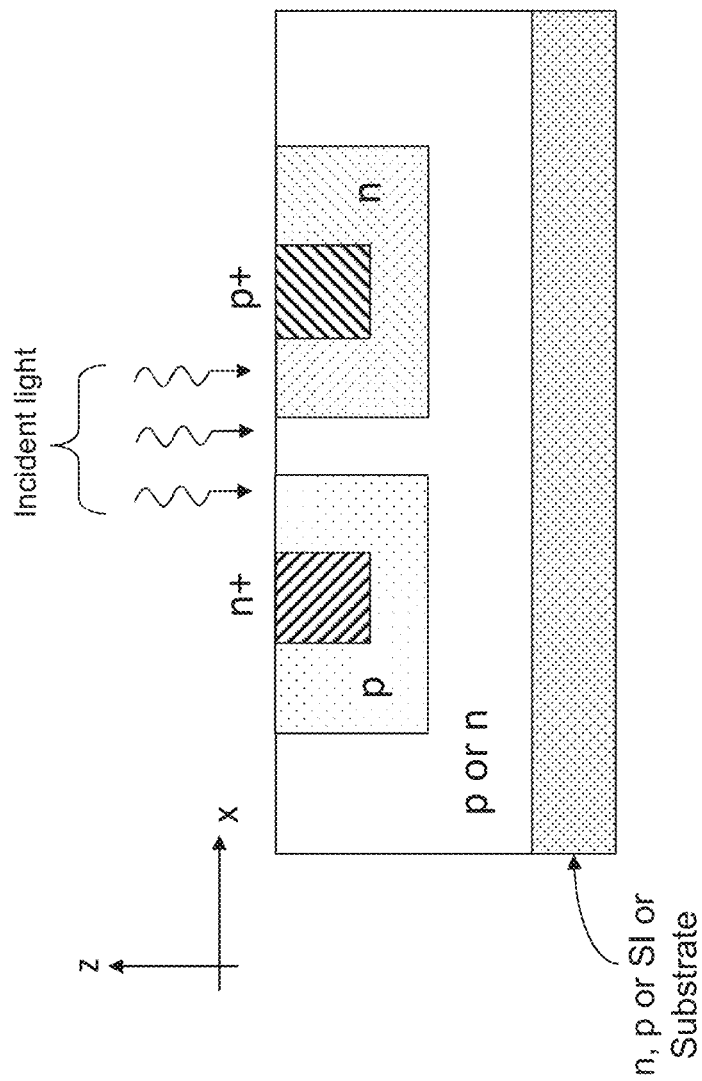
FIG. 13 is a schematic section of a photodetector according to an eighth embodiment of the invention.

FIG. 13 is a schematic section of a photodetector according to an eighth embodiment of the invention. This is a variant of the FIG. 12 embodiment in which the role of the substrate in FIG. 12 is taken by an epitaxial layer. The substrate is therefore not an electrically active part of the device, so may be for example n-type, p-type, semi-insulating semiconductor, sapphire or an insulator, as desired.

Figure 14:
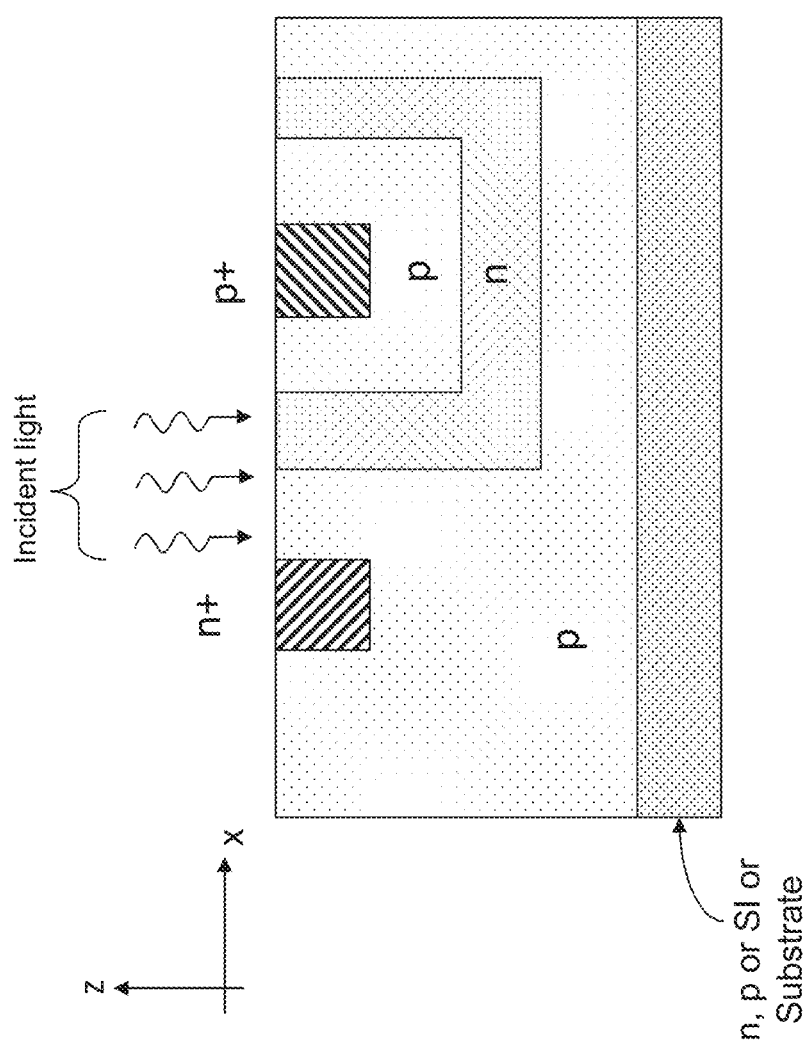
FIG. 14 is a schematic section of a photodetector according to a ninth embodiment of the invention.

FIG. 14 is a schematic section of a photodetector according to a ninth embodiment of the invention. A p-type layer is deposited on a substrate. In the p-type layer, an embedded n-type region is formed, and within the n-type region a p-type region, and within the p-type region a p+ contact region. Laterally offset from the n-type region, an n+ contact region is formed in the p-type layer. It will also be understood that the reverse structure could be implemented. Moreover, the substrate is not an electrically active part of the device, so may be for example n-type, p-type, semi-insulating semiconductor, sapphire or an insulator, as desired. In this device structure the active pn-junction in respect of the time-delayed light-induced current is the one pointed to in the diagram.

Figure 15:
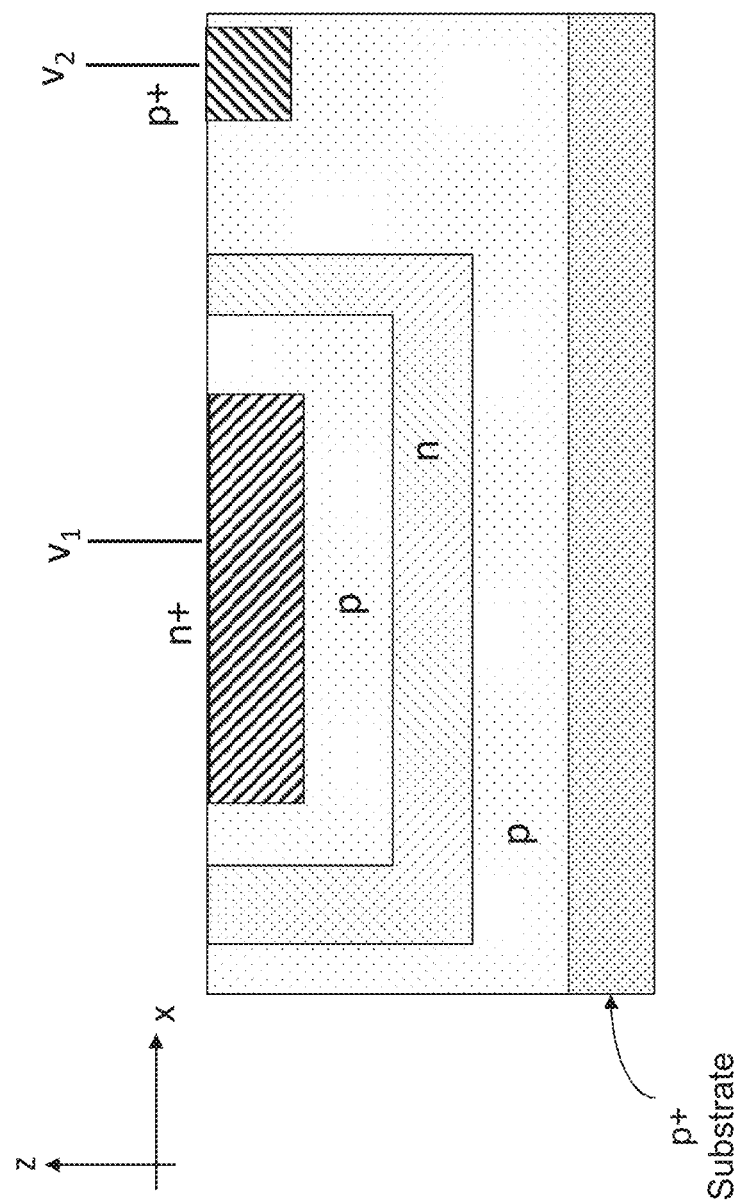
FIG. 15 is a schematic section of a photodetector according to a tenth embodiment of the invention.

FIG. 15 is a schematic section of a photodetector according to a tenth embodiment of the invention. A p-type layer is deposited on a p+ substrate. In the p-type layer, an embedded n-type region is formed, and within the n-type region a p-type region, and within the p-type region a n+ contact region. Laterally offset from the n-type region, a p+ contact region is formed in the p-type layer. It will also be understood that the reverse structure could be implemented. In this device structure the active pn-junction in respect of the time-delayed light-induced current is the one pointed to in the diagram.

Figure 16:
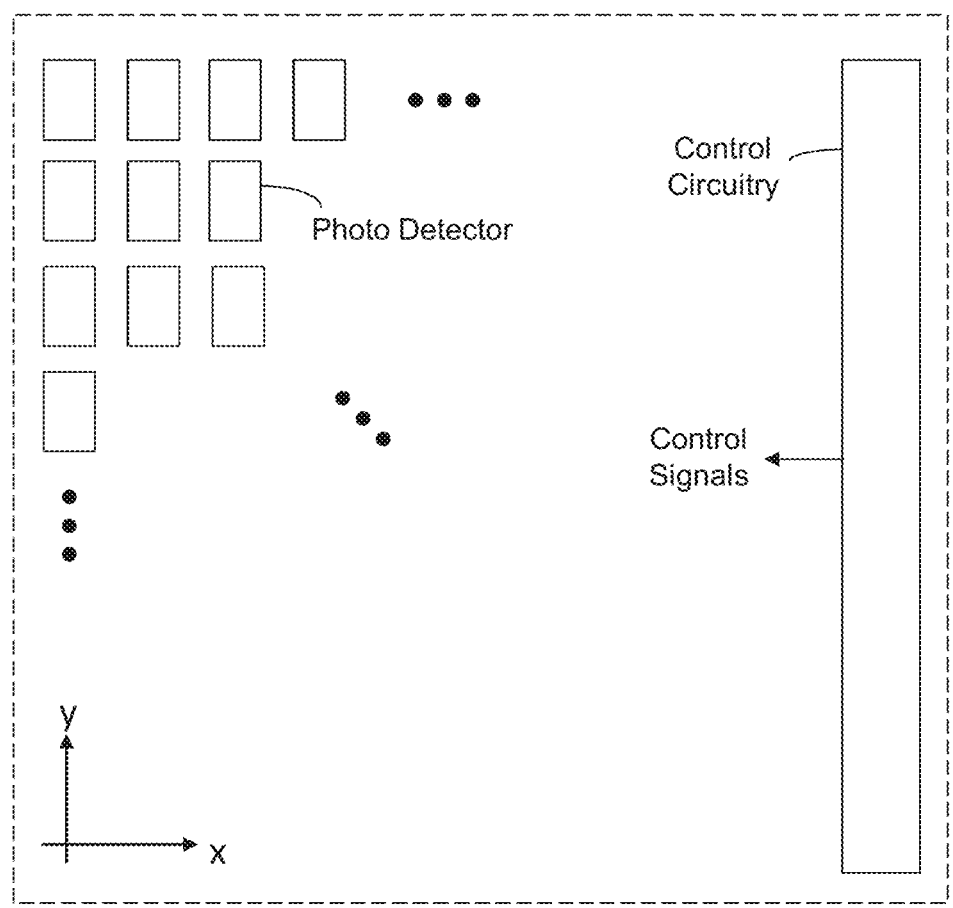
FIG. 16 illustrates a detector array comprising a two-dimensional (2D) array of light sensors, each light sensor of the array being a photodetector as described above.

FIG. 16 illustrates a detector array comprising a two-dimensional (2D) array of light sensors, each light sensor of the array being a photodetector as described above. The detector array may include, in addition to the array of sensors, control circuitry to manage the acquisition, capture and/or sensing operations of the light sensors of the array. For example, the control circuitry (which may be integrated on the same substrate as the sensors) may control or enable/disable the sensors in a manner so that data acquisition or sensing correlates to the data rate of the transmission; the detector array may be coupled to a plurality of fiber optic output devices wherein each fiber optic device is associated with one of the sensors, or a group of the sensors. The sensors may be configured and/or arranged in any array architecture as well as in conjunction with any type of integrated circuitry. Further, any manufacturing technique may be employed to fabricate the array.

Figure 17:
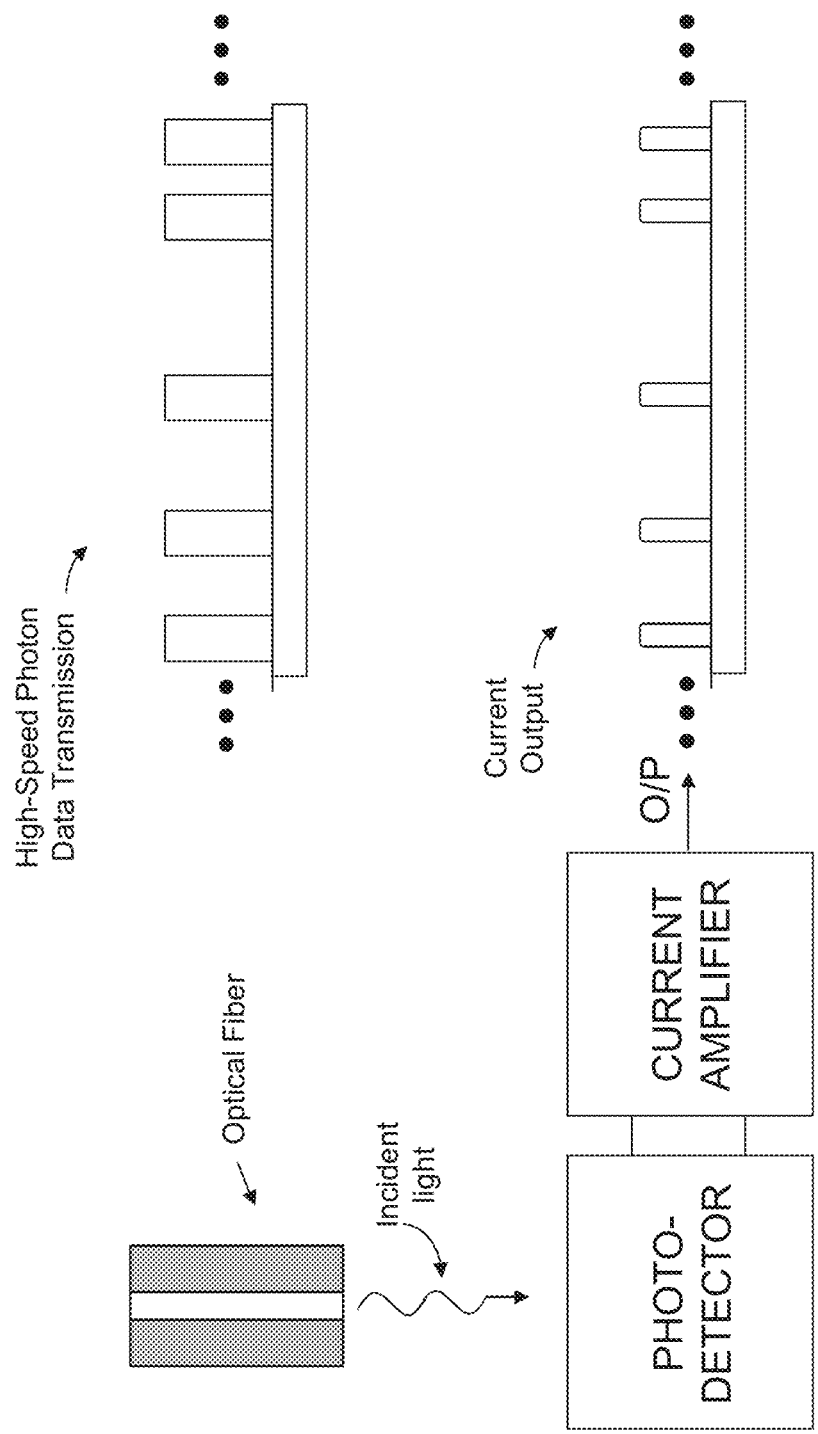
FIG. 17 shows a photodetector according to any one of the above embodiments in operation as a high-speed optoelectronic converter.

FIG. 17 shows a photodetector according to any one of the above embodiments coupled to an optional current amplifier. The photodetector is illustrated in operation as a high-speed optoelectronic converter operable to convert an optical pulse train, or other more complex signal, into an equivalent electrical pulse train, or other more complex signal. The schematically illustrated pulse train above shows the optical signal transmitted through the optical fiber, and the schematically illustrated pulse train below shows the electrical signal output by the photodetector that has received the optical signal as input. Due to the large output signal, the photodetector does not require an amplifier and can be directly connected to digital circuits. Not requiring an amplifier is advantageous, since an amplifier is a noise source.

It should be noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" may mean, among other things, a current or voltage signal(s) whether in an analog or a digital form, which may be a single bit (or the like) or multiple bits (or the like).

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The present inventions are also directed to such representation of the circuitry described herein, and/or techniques implemented thereby, and, as such, are intended to fall within the scope of the present inventions.

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations and simulation instruction-based expressions using computer aided design, simulation and/or testing tools. The simulation of the circuitry of the present inventions, including the photodetector and/or techniques implemented thereby, may be implemented by a computer system wherein characteristics and operations of such circuitry, and techniques implemented thereby, are simulated, imitated, replicated, analyzed and/or predicted via a computer system. The present inventions are also directed to such simulations and testing of the inventive device and/or circuitry, and/or techniques implemented thereby, and, as such, are intended to fall within the scope of the present inventions. The computer-readable media and data corresponding to such simulations and/or testing tools are also intended to fall within the scope of the present inventions.

It will be clear to one skilled in the art that many improvements and modifications can be made to the foregoing exemplary embodiment without departing from the scope of the present disclosure.

What is claimed is:

1. A photodetector device comprising:
    first and second light absorbing regions composed of semiconductor material, doped respectively n-type and p-type, wherein the first and second light absorbing regions are formed as respective epitaxial layers arranged on top of one another in relation to a substrate, wherein the light absorbing regions are configured to generate pairs of electrons and holes in response to absorption of photons when light is incident on the device;
    first and second contact regions composed of semiconductor material and doped respectively p-type and n-type, wherein the contact regions have higher doping concentrations than the light absorbing regions, and are labelled as p+ and n+ respectively; and
    first and second contacts connected to the first and second contact regions respectively,
    wherein the n-type and p-type light absorbing regions and the n+ and p+ contact regions are arranged in a sequence n+p n p+ so that, after a voltage applied between the n+ and p+ contacts is switched from a reverse bias to a forward bias, electrons and holes which are generated in the light absorbing regions in response to photon absorption drift towards the p+ and n+ contact regions respectively, which causes current to start to flow between the contacts after a time delay which is inversely proportional to the incident light intensity.

2. The device of claim 1, wherein the first and second contact regions are arranged laterally spaced apart either side of the first and second light absorbing regions.

3. The device of claim 1, further comprising insulating trenches extending vertically through the light absorbing regions and at least one of the contact regions so as to subdivide the photodetector into an array of pixels that are independently contacted.

4. The device of claim 3, further comprising a semiconductor circuit layer arranged on the epitaxial layer that forms one of the first and second contact regions, the circuit layer comprising an array of read out sensors for the photodetector's pixel array electrically connected to the pixels with vias.

5. The device of claim 3, wherein each pixel is subdivided into an array of sub-pixels by further insulating trenches which for each pixel are disposed laterally inside the pixel-defining insulating trenches and which extend vertically through one of the contact regions and at least one of the light absorbing regions, but not as far as the other of the contact regions, so that the sub-pixels of any one pixel remain commonly contacted.

6. The device of claim 1, wherein the first and second light absorbing regions are arranged such that one of the first and second light absorbing regions is formed as an epitaxial layer on a substrate, or integrally with the substrate, and the other of the first and second light absorbing regions is formed as an embedded region within the epitaxial layer.

7. The device of claim 1, wherein the first and second light absorbing regions are arranged such that one of the first and second light absorbing regions is formed in a first part as an epitaxial layer on a substrate, or integrally with the substrate, and in a second part as an embedded region within the epitaxial layer or the substrate, and wherein the other of the first and second light absorbing regions is formed as a further embedded region within the epitaxial layer.

8. The device of claim 7, wherein the embedded region and the further embedded region are separated laterally by a portion of the epitaxial layer or the substrate.

9. The device of claim 7, wherein one of the first and second contact regions is formed as a still further embedded region within the embedded region of the first or second light absorbing regions respectively.

10. The device of claim 7, wherein the first and second contact regions are formed as respective still further embedded regions within the embedded regions of the first and second light absorbing regions respectively.

11. The device of claim 1, wherein one of the first and second contact regions is formed as an epitaxial layer on the substrate and at least one of the first and second light absorbing regions is formed at least in part as a further epitaxial layer on the epitaxial layer of said one of the first and second contact regions.

12. The device of claim 1, wherein at least one of the first and second contact regions is formed as an embedded region within an epitaxial layer which forms at least a part of the first and second light absorbing regions respectively.

13. The device of claim 1, wherein the first and second contact regions are formed as respective laterally spaced apart first and second embedded regions within an epitaxial layer which forms at least a part of the first and second light absorbing regions respectively.

14. The device of claim 1, wherein one of the first and second contact regions is formed as laterally spaced apart first and second embedded regions formed within an epitaxial layer which forms at least a part of one of the first and second light absorbing regions respectively.

15. A method of manufacturing a photodetector device, the method comprising:
    fabricating first and second light absorbing regions using semiconductor material doped respectively n-type and p-type, wherein the first and second light absorbing regions are fabricated as respective epitaxial layers arranged on top of one another in relation to a substrate, wherein the light absorbing regions are configured to generate pairs of electrons and holes in response to absorption of photons when light is incident on the device;

fabricating first and second contact regions composed of semiconductor material and which are doped respectively p-type and n-type, wherein the contact regions have higher doping concentrations than the light absorbing regions, and are labelled as p+ and n+ respectively; and providing first and second contacts connected to the first and second contact regions respectively, wherein the n-type and p-type light absorbing regions and the n+ and p+ contact regions are arranged in a sequence n+p n p+ so that, after a voltage applied between the n+ and p+ contacts is switched from a reverse bias to a forward bias, electrons and holes which are generated in the light absorbing regions in response to photon absorption drift towards the p+ and n+ contact regions respectively, which causes current to start to flow between the contacts after a time delay which is inversely proportional to the incident light intensity.

16. The method of claim 15, further comprising fabricating insulating trenches extending vertically through the light absorbing regions and at least one of the contact regions so as to subdivide the photodetector into an array of pixels that are independently contacted.

17. A method of operating a photodetector device, the method comprising:

providing a photodetector device with:

first and second light absorbing regions composed of semiconductor material doped respectively n-type and p-type, wherein the first and second light absorbing regions are fabricated as respective epitaxial layers arranged on top of one another in relation to a substrate, wherein the light absorbing regions are configured to generate pairs of electrons and holes in response to absorption of photons when light is incident on the device;

first and second contact regions composed of semiconductor material and doped respectively p-type and n-type, wherein the contact regions have higher doping concentrations than the light absorbing regions, and are labelled as p+ and n+ respectively; and first and second contacts connected to the first and second contact regions respectively, wherein the n-type and p-type light absorbing regions and the n+ and p+ contact regions are arranged in a sequence n+p n p+; and operating the photodetector device by repeatedly:

applying a voltage to reverse bias the n+ and p+ contacts;

switching the reverse bias voltage to a forward bias voltage so that after said switching electrons and holes which are generated in the light absorbing regions in response to photon absorption drift towards the p+ and n+ contact regions respectively; and sensing for onset of current flow between the first and second contacts and measuring a time delay between said switching and said onset, wherein the time delay is inversely proportional to the incident light intensity.

* * * * *